(12) United States Patent
Feldman

(10) Patent No.: US 6,724,158 B1
(45) Date of Patent: Apr. 20, 2004

(54) POWER LINEARIZATION TECHNIQUE FOR CONTROLLING THE LUMINANCE OF LIGHT EMITTING DISPLAY DEVICES

(75) Inventor: Alan S. Feldman, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/282,892

(22) Filed: Oct. 28, 2002

(51) Int. Cl.[7] ................................................ H05B 41/36
(52) U.S. Cl. ........................................ 315/291; 315/287
(58) Field of Search ................................. 315/246, 287, 315/291, 307, 209 R, 224, DIG. 2, DIG. 5; 323/273, 274

(56) References Cited

U.S. PATENT DOCUMENTS

| | | | | |
|---|---|---|---|---|
| 5,691,607 A | * | 11/1997 | Zawislak et al. | 315/308 |
| 5,923,129 A | * | 7/1999 | Henry | 315/307 |
| 6,144,194 A | * | 11/2000 | Varga | 323/285 |
| 6,488,390 B1 | * | 12/2002 | Lebens et al. | 362/231 |

* cited by examiner

Primary Examiner—Wilson Lee
Assistant Examiner—Thuy Vinh Tran

(57) ABSTRACT

A circuit and method for providing a linear power to a load uses pulse modulation technique where the frequency and pulse width of the pulse width modulated waveform driving the load are varied simultaneously. In one aspect of the disclosure, a pulse width modulator circuit is responsive to a command drive signal for producing the pulse width waveform the width of the pulses varying accordingly. In addition, a frequency control circuit that is also responsive to the command drive signal provides a control current to the pulse width modulator circuit wherein the frequency of the waveform is varied as the pulse widths are varied.

9 Claims, 2 Drawing Sheets

POWER LINEARIZATION TECHNIQUE FOR CONTROLLING THE LUMINANCE OF LIGHT EMITTING DISPLAY DEVICES

TEHCNICAL FIELD OF THE INVENTION

The present invention generally relates to display devices, and more particularly, to a method and apparatus for controlling luminance of light emitting display devices.

BACKGROUND OF THE INVENTION

The dashboard displays of modem transportation equipment: automobiles, aircraft, ships, trains, even the space shuttle, etc., require efficient, uniform illumination in order to accommodate operation under low ambient lighting conditions, e.g., evening or nighttime hours. The illumination should be made variable and controlled manually or automatically via a closed-loop sensor controlled feedback system, to accommodate changes in available ambient light.

Early attempts to satisfy these requirements employed rheostatically controlled incandescent lamps and even light emitting diodes, for instance. In other words, the lamps were dimmed by dropping power across an adjustable resistive element in series with the lamps. This technique is both inefficient and unreliable as a significant amount of power is dissipated in the rheostat which, in turn , leads to a very limited service life. Also, most mechanical devices of this type have numerous other "nuisance failure" mechanisms, e.g. wear, dirt contamination, open resistive element, to name just a few.

Controls of the type aforementioned typically have an exponentially decaying power curve associated therewith. This non-linear effect causes the lamp to dim quickly at first, then at an ever-decreasing rate, as the rheostat is varied. Conversely, the lamp brightens very slowly at first and then suddenly becomes very bright. Neither of the foregoing situations is desirable, especially to an aircraft pilot. In an attempt to eliminate or dampen the aforedescribed situation, one solution may be to use an "audio taper" rheostat (exponentially varying resistive element) in conjunction with the lamps. However, these devices are expensive, difficult to obtain, and have very limited resistance ranges.

Another technique for controlling the luminance of lamps employs the use of pulse width modulation (PWM). Pulse width modulation is well known in the art and allows the lamps to be turned on and off at a set frequency utilizing a variable duty cycle: the duty cycle being defined as the ratio of the "on" time to the "total" time. Using PWM techniques, the duty cycle can easily be varied from zero (fully off) to 100 percent (fully on).

The PWM technique provides a significant improvement over the variable series resistive element described above. It is very efficient, and virtually no power is dissipated in the control potentiometer. Pulse width modulation techniques are well known to those skilled in the art and will not be discussed here. The problem with the PWM technique, although not as pronounced as with the series rheostat approach, is the non-linear output produced. The lamp power, or luminance, is actually the root-mean-square (RMS) of the pulse train presented to the lamps. Again, the effective, or RMS, values of periodic waveforms are well known and will not be discussed herein. Suffice it to say that the lamp illuminates much faster than desired, and conversely, extinguishes much slower due to the non-linearity of the lamp power associated with the RMS values of the pulse train presented to the lamps.

In view of the foregoing, it should be appreciated that it would be desirable to provide methods and apparatus for delivering linear power drive to a light source. Furthermore, additional desirable features will become apparent to one skilled in the art from the drawings, foregoing background of the invention, following detailed description of the invention.

BRIEF SUMMARY OF THE INVENTION

An apparatus is provided for delivering linear power drive to a light source. The apparatus comprises a pulse width modulator responsive to a command voltage drive signal for providing a pulse width modulated signal at an output. The widths of the pulses and the frequency varying simultaneously as the command voltage drive signal is varied, and the output of the pulse width modulator being coupled to the light source. The apparatus also comprises a frequency control circuit responsive to the command voltage drive signal for supplying a control current to the pulse width modulator such that the frequency of the pulse width modulated output signal is varied.

In addition to the apparatus for delivering linear power drive to a light source, a method is provided for delivering linear power drive to a light source. The method comprises the step of providing a pulse modulation signal with the widths of the pulses thereof being varied in accordance with a command signal. In addition, the method comprises the step of varying the frequency of the pulse modulation signal simultaneously with the widths of the pulses being varied.

BRIEF DESCRIPTION OF THE DRAWINGS

The present invention will hereinafter be described in conjunction with the appended drawing figures, wherein like numerals denote like elements, and in which.

DETAILED DESCRIPTION OF THE INVENTION

The present invention, as will hereinafter be described, provides linear power drive for controlling the luminance level of various displays including, but not limited to, incandescent lamps and light emitting diodes (LEDs) in a linear fashion.

Figure 1:
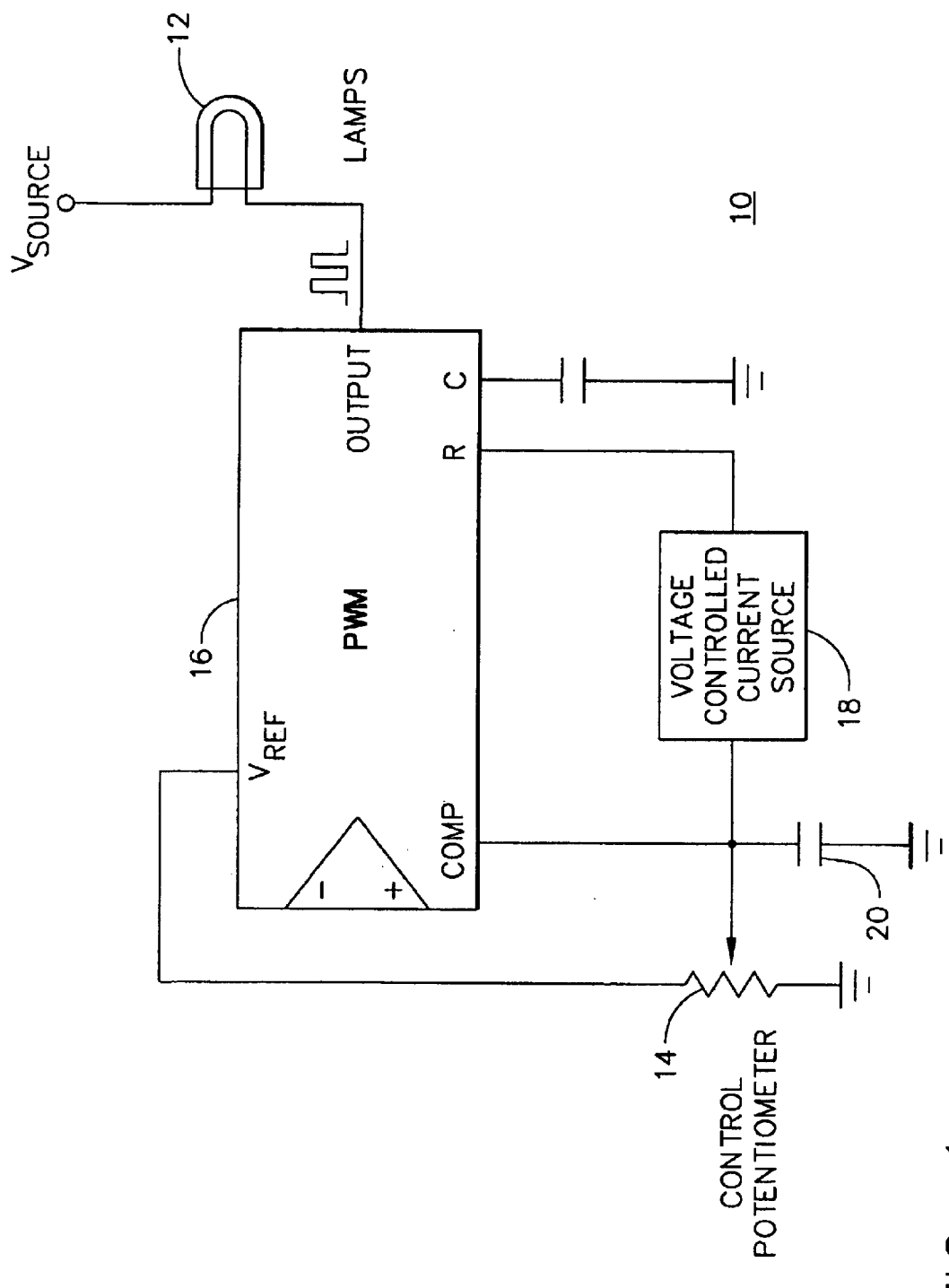
FIG. 1 is a block diagram of pulse width modulation system usable in describing the instant invention.

Turning now to FIG. 1, there is shown pulse width modulation circuitry 10 for controlling the current through lamp 12 such that the luminance thereof is linearly controlled in response to adjusting control potentiometer 14. A conventional pulse width modulator (PWM) integrated circuit 16 is used which is responsive to the voltage developed across potentiometer 14 for providing output current pulses for turning on lamp 12. The widths of these current pulses are varied as the voltage across potentiometer 14 is varied. Voltage controlled current source 18 is also responsive to the voltage developed across potentiometer 14 and provides a control signal to PWM 16 which in turns adjusts the frequency of the current pulses appearing at the output of PWM 16. As the frequency of the pulse modulation is varied simultaneously with the width of the current pulses, the RMS value of the power presented to lamp 12 will vary linearly. Thus, the luminance of lamp 12 is both increased and decreased in a linear fashion as the voltage developed at the wiper arm of potentiometer 14 is varied (and across capacitor 20) accordingly.

Figure 2:
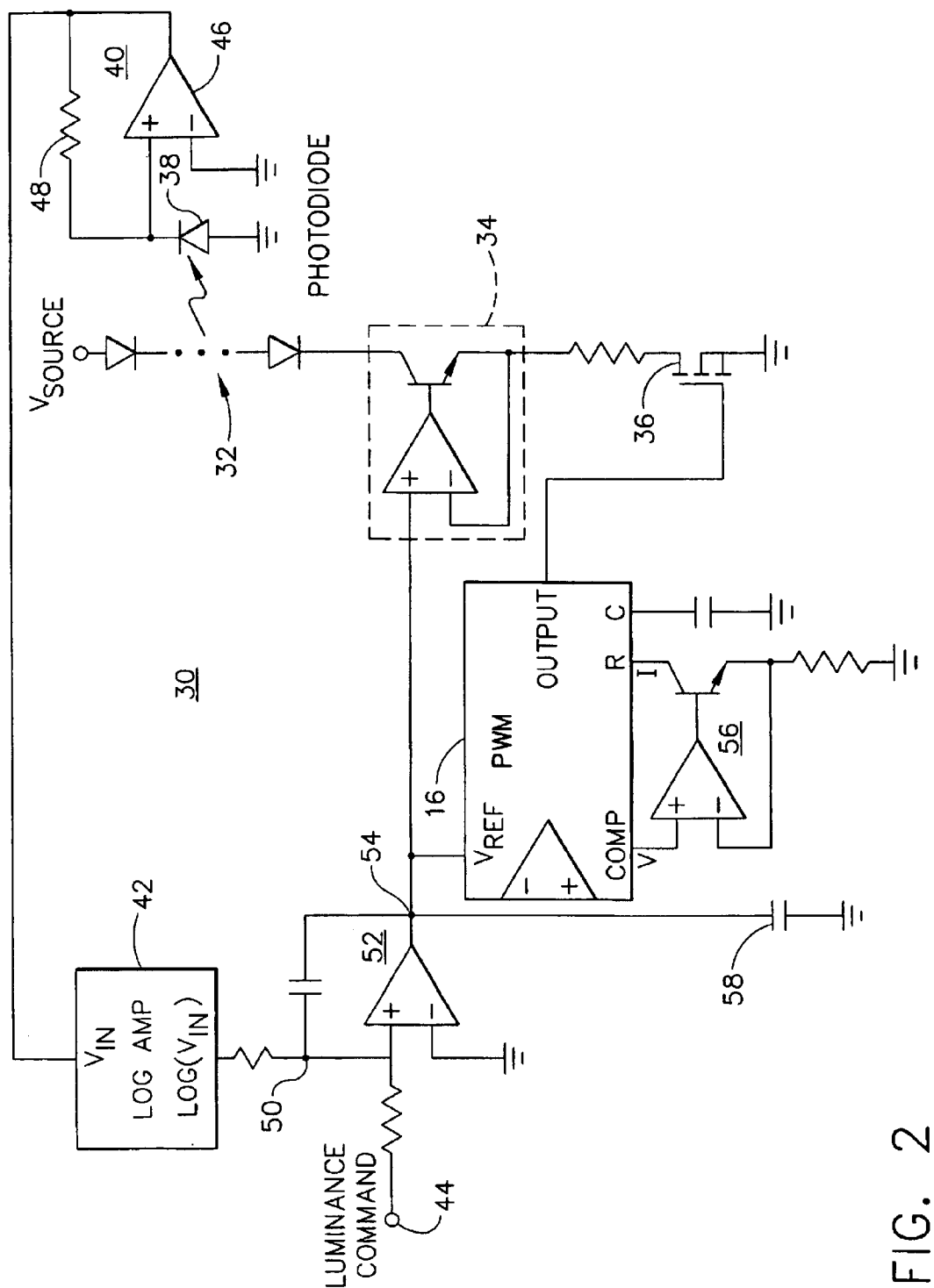
FIG. 2 is a block diagram of the pulse width modulation apparatus of the present invention for providing linear power drive control of luminance devices.

Referring to FIG. 2 there is shown novel drive circuitry 30 employing a pulse modulation technique for providing linear power to a load. In this case, the load is illustrated as a string of light emitting diodes (LEDs), represented by reference numeral 32, serially connected between a voltage source and the output of voltage controlled current source 34. Controlled current source 34 is gated on and off as driver FET 36 is turned on and off by pulse width modulator 16 the output of which is coupled to the gate of FET 36.

A feedback network consisting of photodiode 38, transimpedance amplifer 40, and logarithmic amplifier 42 provides feedback to maintain the luminance of the LEDs set by a driving source command signal applied to input 44. Hence, photodiode 38 senses the luminance of one or more of lamps/LEDs comprising the string of diodes 32 and drives transimpedance amplifier 40 consisting of operational amplifier 46 and resistor 48. Transimpedance amplifier 40 provides a feedback voltage to the input of logarithmic amplifier 42 responsive to the photodiode current. Logarithmic amplifier 42 converts the voltage at its input to a logarithmic voltage that is combined with the driving source command signal at summing node 50. The composite signal at summing node 50 is applied to the input of integrator 52 which provides an integrated voltage at node 54 that is provided to controlled current source 34, and the pulse modulator circuitry comprising pulse width modulator 16 and frequency control circuit 56.

Voltage controlled current source 34 provides the primary current control through LEDs 32. Thus, as the integrated composite voltage at node 54 is varied, the current flow through the LEDs is varied accordingly.

The integrated composite voltage appearing at node 54 is applied across capacitor 58 and provides the control voltage to pulse width modulator 16 for varying the width of the modulation pulses supplied at the output of pulse width modulator 16 to the gate of control switch or FET 36. Frequency control circuit 56 converts the voltage developed across capacitor 58 into a representative current for driving the resistor input of pulse width modulator 16 which in turn varies the frequency of the pulses supplied to FET 36.

Thus, as described above, drive circuitry 30 varies the pulse widths of the pulse width modulation load driving signal as well as simultaneously varying the frequency thereof responsive to the command signal applied to the circuitry. Hence, as the pulse width increases, so does the frequency of the PWM signal driving the load devices. Additionally, the current is also varied in response to the command signal and increases from low luminance to high luminance as the pulse widths and frequency of the load driving modulation signal increase. This results in a substantially linear power delivery to the load devices.

Hence, what has been described is a novel power linearization technique and apparatus for providing a linear power delivery to non-linear loads such as lamps and LEDs. The loads are driven by a pulse modulated signal the widths of the pulses and the frequency thereof, simultaneously being varied in response to a supplied luminance command signal.

While the invention has been described in terms related to the preferred embodiment disclosed herein, it will become apparent to those skilled in the art that modifications may be made which however remain within the scope of the appended claims.

What is claimed is:

1. An apparatus for delivering linear power drive to a light source, comprising:

a pulse width modulator having an output coupled to the light source, said pulse width modulator configured to be responsive to a command voltage drive signal such that a pulse width modulated signal having a plurality of pulses and a frequency is provided at the output and widths of the plurality of pulses vary as said command voltage drive signal varies;

a frequency control circuit coupled to the pulse width modulator, said frequency control circuit configured to be responsive to said command voltage drive signal such that a control current is provided to said pulse width modulator that varies the frequency as said command voltage drive signal varies in order to vary the frequency substantially simultaneously with the varying of the widths of the plurality of pulses; and a feedback loop configured to be responsive to a current flowing in the light source and further configured to provide a logarithmic voltage.

2. The apparatus of claim 1 further comprising a summing circuit that is configured to sum said logarithmic voltage and a luminance command signal in order to form a composite signal.

3. The apparatus of claim 2 further comprising an integrator that is configured to produce said command voltage drive signal with an integration of said composite signal.

4. The apparatus of claim 3 further comprising a voltage controlled current source coupled to the light source that is configured to be responsive to said command voltage drive signal for varying the magnitude of current flowing in the light source.

5. The apparatus of claim 4 further comprising a switching circuit that is configured to be responsive to said pulse modulated signal supplied thereto from said output of said pulse width modulator for gating said voltage controlled current source on and off.

6. The apparatus of claim 5 wherein the light source comprises a plurality of light emitting diodes coupled between a voltage source and the output of said voltage controlled current source.

7. The apparatus of claim 6 wherein said feedback loop comprises:

a diode configure to sense luminance of at least one of said light emitting diodes;

a transimpedance amplifier coupled to said diode and configured to convert the current flowing in said diode to a voltage; and a logarithmic amplifier having an input coupled to output of said transimpedance amplifier.

8. The apparatus of claim 7 wherein said diode is a photodiode.

9. The apparatus of claim 8 wherein said switching circuit is a field effect transistor.

* * * * *